US010787096B2

(12) United States Patent
Juhl et al.

(10) Patent No.: US 10,787,096 B2
(45) Date of Patent: Sep. 29, 2020

(54) BATTERY SYSTEM FOR A TRANSPORTATION VEHICLE AND TRANSPORTATION VEHICLE

(71) Applicant: VOLKSWAGEN AKTIENGESELLSCHAFT, Wolfsburg (DE)

(72) Inventors: Jochen Juhl, Lüdersfeld (DE); Stephan Blumenthal, Dannstadt-Schauernheim (DE)

(73) Assignee: VOLKSWAGEN AKTIENGESELLSCHAFT, Wolfsburg (DE)

( * ) Notice: Subject to any disclaimer, the term of this patent is extended or adjusted under 35 U.S.C. 154(b) by 43 days.

(21) Appl. No.: 16/372,461

(22) Filed: Apr. 2, 2019

(65) Prior Publication Data
US 2019/0299810 A1 Oct. 3, 2019

(30) Foreign Application Priority Data
Apr. 3, 2018 (DE) .......................... 10 2018 204 971

(51) Int. Cl.
*B60L 58/22* (2019.01)
*B60L 58/10* (2019.01)
(Continued)

(52) U.S. Cl.
CPC .............. *B60L 58/22* (2019.02); *B60L 58/10* (2019.02); *B60R 16/033* (2013.01);
(Continued)

(58) Field of Classification Search
CPC ....... B60L 58/22; B60L 58/10; G01R 31/396; G01R 31/3835; G01R 31/007; H02J 7/00; H02J 7/0014; H02J 7/0026
(Continued)

(56) References Cited

U.S. PATENT DOCUMENTS

| 8,159,184 B2* | 4/2012 | Emori | ..................... B60L 58/14 320/116 |
| 8,426,047 B2* | 4/2013 | Emori | ................... H02J 7/0019 429/61 |

(Continued)

FOREIGN PATENT DOCUMENTS

| DE | 69118469 T2 | 11/1996 |
| DE | 69318787 T2 | 10/1998 |
| DE | 10143732 A1 | 3/2002 |

*Primary Examiner* — Tomi Skibinski
(74) *Attorney, Agent, or Firm* — Barnes & Thornburg LLP

(57) ABSTRACT

A battery system for a transportation vehicle having at least one battery module with a number of battery cells and a cell controller for monitoring and adjusting the state of charge of the battery cells, and a battery management controller coupled to the cell controller, wherein the cell controller has an analog-to-digital converter, which is led to the battery cells of the battery module by a filter circuit, wherein a frequency circuit for adjusting a cut-off frequency of the filter circuit, wherein the cut-off frequency of the filter circuit is adjusted to a first frequency value during a sampling period in which the cell controller monitors the battery cells and to a second frequency value during a diagnostics period in which the battery management controller monitors the battery cells.

14 Claims, 2 Drawing Sheets

(51) Int. Cl.
*B60R 16/033* (2006.01)
*H02J 7/00* (2006.01)
*G01R 31/3835* (2019.01)
*G01R 31/396* (2019.01)
*G01R 31/00* (2006.01)

(52) U.S. Cl.
CPC ....... *G01R 31/3835* (2019.01); *G01R 31/396* (2019.01); *H02J 7/00* (2013.01); *H02J 7/0014* (2013.01); *H02J 7/0026* (2013.01); *B60Y 2400/112* (2013.01); *G01R 31/007* (2013.01)

(58) Field of Classification Search
USPC ........................................ 307/9.1, 10.1, 10.7
See application file for complete search history.

(56) References Cited

U.S. PATENT DOCUMENTS

2015/0340743 A1* 11/2015 Fink ................. B60L 58/22
429/61
2019/0047438 A1* 2/2019 Jaster ............... G01R 19/16542

* cited by examiner

BATTERY SYSTEM FOR A TRANSPORTATION VEHICLE AND TRANSPORTATION VEHICLE

PRIORITY CLAIM

This patent application claims priority to German Patent Application No. 10 2018 204 971.8, filed 3 Apr. 2018, the disclosure of which is incorporated herein by reference in its entirety.

SUMMARY

Illustrative embodiments relate to a battery system for a transportation vehicle, having at least one battery module comprising a number of battery cells and comprising a cell controller for monitoring and adjusting the state of charge of the battery cells, and a battery management controller, which is coupled in terms of signal technology to the or to each cell controller, wherein the cell controller has an analog-to-digital converter, which is led to the battery cells of the battery module by a filter circuit. Illustrative embodiments further relate to a transportation vehicle having such a battery system.

BRIEF DESCRIPTION OF THE DRAWINGS

Exemplary embodiments are explained in more detail below with reference to the drawings. In the drawings, in simplified illustrations.

DETAILED DESCRIPTION

Figure 1:
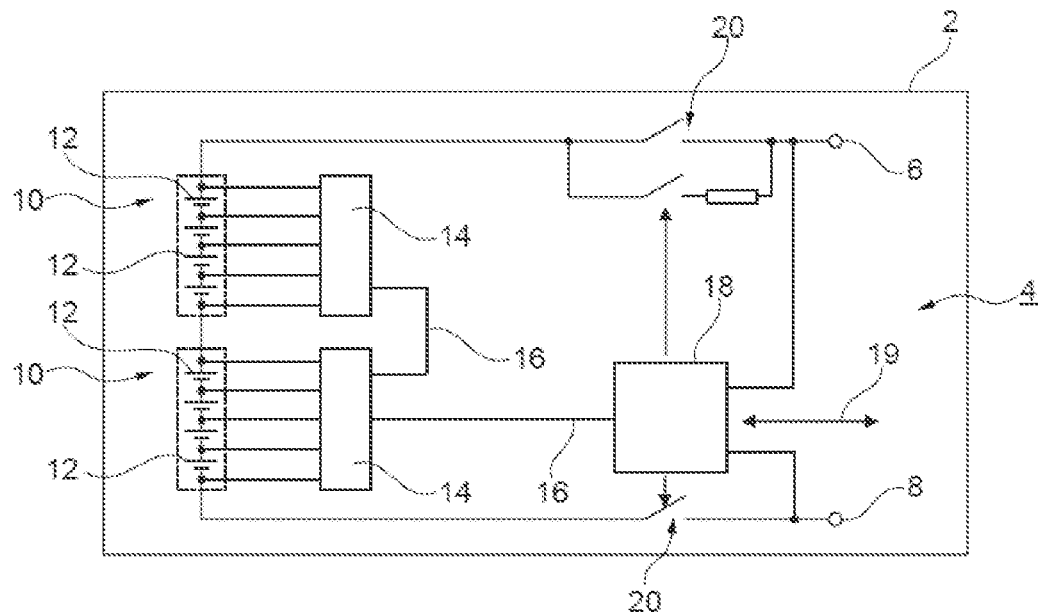
FIG. 1 schematically shows a transportation vehicle comprising a battery system as a block circuit diagram.

In a transportation vehicle, an on-board power supply system (transportation vehicle on-board power supply system) serves to supply power to electrical loads and devices by way of an operating voltage of the on-board power supply system (on-board power supply system voltage). In the case of an electrically driven or drivable transportation vehicle, such as an electric or hybrid transportation vehicle, for example, a traction power supply system is provided in addition to the on-board power supply system as a high-voltage supply system, the traction power supply system providing the higher electrical power necessary for the electromotive drive. Such on-board power supply systems or traction power supply systems are generally supplied with power by a respective energy store, for example, as an electrochemical battery system of the type mentioned at the beginning. In this case, such a battery system is to be understood as meaning, in particular, a so-called secondary battery of the transportation vehicle. In the case of such a (secondary) battery, converted chemical energy can be recovered by an electrical charging process.

Such batteries or battery systems are embodied, in particular, as electrochemical rechargeable batteries, for example, as lithium-ion rechargeable batteries, in which a number of individual battery or rechargeable battery cells are combined to form one or more battery modules.

For the purpose of safe and reliable operation of the battery system, a battery management system (BMS) is generally provided. The battery management system monitors the operating limits of the battery system and, where necessary, takes measures to prevent damage to the battery system and the surroundings thereof. Beyond these safety functions, the BMS determines state variables of the battery modules or of the individual battery cells, such as, for example, the current state of charge, the available power and/or the state of aging thereof. The BMS also has various communication interfaces, for example, to exchange data with a superordinate transportation vehicle system.

The BMS generally comprises a battery management controller (BMC, battery pack controller) and a number of cell controllers associated with the battery modules, which cell controllers are coupled to one another in terms of signal technology, for example, by a CAN (central area network) bus. During normal operation of the battery system, the operating states of the individual battery modules or battery cells are monitored by the respectively associated cell controller over the course of individual cell management, and the corresponding measurement data are transmitted from the cell controllers to the battery management controller. In this case, the cell controllers are configured, in particular, for balancing the charge between individual battery cells over the course of the individual cell management; this means that the cell controllers have a balancing stage by which differences in charge between individual battery cells can be balanced.

The cell controllers each have a cell voltage measurement device comprising at least one analog-to-digital converter for the purpose of monitoring the battery cells, the analog-to-digital converter sampling the (battery) cell voltages of the battery cells by a sampling frequency and converting the cell voltages to a digital (measurement) signal. To satisfy the Nyquist-Shannon sampling theorem, a filter circuit, in particular, a low-pass filter, is often connected upstream of the input connections of the analog-to-digital converters of the cell controllers. This means that a cut-off frequency of the filter circuit may be lower than or equal to half the sampling frequency of the analog-to-digital converter. According to the Nyquist-Shannon sampling theorem, a signal band-limited to a maximum frequency can be reconstructed exactly from a series of equidistant sampling values when sampling has taken place at a sampling frequency that is at least double as high as the maximum frequency of the signal.

The BMS controls and/or regulates and monitors the battery system during operation, optionally during a charging or discharging process. The state of charge (SOC) on the individual cell and system plane is monitored here by the cell controllers. Using further sensor systems, the battery currents, the battery voltages and the battery temperatures of the battery cells and of the entire system are measured and regulated. The battery management controller makes possible here error detection or error logging as well as the connection and disconnection of the battery system.

In the case of electrically driven or drivable transportation vehicles, such as electric or hybrid transportation vehicles, for example, the battery system is an emission-relevant system of the transportation vehicle. It is therefore desirable for the battery system to meet the requirements of the OBD (on-board diagnostics), in particular, the so-called OBD2. This means that the operating state of the battery system, in particular, of each battery module or each battery cell, is monitored during driving operation, and errors arising are stored in an error memory of a (transportation vehicle) control device. In other words, a diagnostic analysis or survey of the operating states of all of the battery modules takes place periodically or regularly. According to the OBD2, it is required that a diagnostic analysis of all of the sensors and actuators of the battery system has to take place periodically after 500 ms (milliseconds).

To reduce the cost of the battery system, it is desirable for the number of CAN nodes of the BMS to be reduced. At the same time, the BMS, and therefore the cell controllers, should also satisfy the OBD2. To this end, battery-system-internal interfaces for signal communication between the cell controllers are often used, as a result of which the number of CAN nodes should be reduced. This causes a restriction of the maximum transmissible measurement values. This consequently has a negative effect on a possible sampling rate and on the sampling frequencies of the individual cell voltages.

The cut-off frequency of the filter circuit has a direct influence on the required diagnostics time over the course of the OBD2, that is to say that period for diagnostic analysis of the cell voltage measurement devices or of the balancing stages. Since no measurement values for the normal operation of the battery system, in particular, with respect to the individual cell management of the cell controllers, are detected during such a diagnostic analysis, the lowest possible diagnostics time is desirable. This corresponds to the highest possible cut-off frequency of the filter circuits. On the other hand, during normal operation, a comparatively low cut-off frequency of the filter circuits is desirable to ensure the most optimum and error-free possible sampling of the cell voltages by the analog-to-digital converters.

There is therefore an exchange relationship between the lowest possible cut-off frequency of the filter circuit for normal operation on the one hand and the highest possible cut-off frequency of the filter circuit for the diagnostic operation of the battery system on the other hand. To avoid this exchange relationship, it is conceivable, for example, to provide direct communication between each individual cell controller and the battery management controller so that no limitation arises on account of the interface transmission. As a result thereof, however, the number of CAN nodes and the necessary installation space requirement as well as the production and assembly costs would be increased.

As an alternative, redundant measurement systems, which are provided only for the diagnostic analysis, are likewise conceivable. However, these redundant measurement systems likewise bring about an increase in the installation space requirement as well as the production costs. Furthermore, it is conceivable to use a battery system that at least partly breaches either the requirements of the sampling theorem or of the OBD2. As a result thereof, however, additional measurement errors are caused and/or a battery system that cannot be used or utilized in electric or hybrid transportation vehicles in an unrestricted manner is accepted.

DE 101 43 732 A1 describes a measurement signal generator circuit for a movement measurement device with a linear scale. The measurement signal generator circuit has a low-pass circuit, such as an active filter, the cut-off frequency of which is varied depending on the movement speed. To this end, the low-pass circuit has a connected capacitance for a time-constant circuit, which is actuated by a movement-speed-dependent clock signal.

DE 693 18 787 T2 discloses a weighing device for weighing a load to be weighed for providing a digital weight signal. The weighing device has a weight detector for generating an analog weight signal. The analog weight signal is filtered by a filter circuit at a first cut-off frequency and is fed to an analog-to-digital converter, which converts the analog weight signal to the digital weight signal. The digital weight signal is then filtered by way of a digital filter at a second cut-off frequency higher than the first cut-off frequency.

DE 691 18 469 T2 discloses a phase-locked-loop circuit comprising a loop filter comprising a frequency regulation circuit for adjusting and/or regulating the cut-off frequency of the loop filter. The known loop filter has a first ohmic resistor along the loop direction. A node point is connected downstream of the first resistor, the node point having a current path connected to ground. In the current path, a second ohmic resistor is connected on the node side and a first capacitor is connected on the ground side. The frequency regulation circuit is connected in parallel with the first capacitor, the frequency regulation circuit having a series circuit of an analog switching element and a second capacitor connected to ground.

The disclosed embodiments provide a suitable battery system for a transportation vehicle. The intention is to specify a battery system that satisfies, on the one hand, the requirements of the sampling theorem and, on the other hand, the requirements of on-board diagnostics of the transportation vehicle. The disclosed embodiments further provide a transportation vehicle comprising such a battery system.

The disclosed battery system is suitable and configured for a transportation vehicle. In this case, the battery system is embodied, in particular, as an electrochemical energy store for a transportation vehicle traction power supply system. The battery system is embodied as a high-voltage voltage supply system of an electric or hybrid transportation vehicle.

The battery system has at least one battery module comprising a number of battery cells and comprising a cell controller for battery cell monitoring. In this case, the cell controller is provided for individual cell management, that is to say for monitoring and adjusting and/or regulating the state of charge of the battery cells. The battery system furthermore has a battery management controller, which is coupled in terms of signal technology to the or to each cell controller. The battery management controller and the or each cell controller form a battery management system (BMS) of the battery system.

Each cell controller has at least one analog-to-digital converter, by which analog voltage signals of the battery cells, subsequently also referred to as cell voltage, are converted to digital measurement signals. The analog-to-digital converters are led to the battery cells of the battery module here by a respective filter circuit. In this case, the filter circuit is integrated into the cell controller or is connected upstream thereof on the battery cell side, for example.

According to the disclosed embodiments, the battery system has a frequency circuit for adjusting a cut-off frequency of the filter circuit. The frequency circuit is in this case optionally part of a respective filter circuit. By the frequency circuit, the cut-off frequency of the filter circuit is adjusted to a first frequency value during a sampling period in which the cell controller monitors the battery cells, that is to say the cell voltage is sampled and digitalized by the analog-to-digital converter by a sampling frequency, and to a second frequency value during a diagnostics period in which the battery management controller monitors the battery cells, that is to say detects the operating state thereof, in particular, the operating state of the associated sensors and actuators of the battery cells. A suitable battery system is realized as a result.

In this case, the sampling period denotes a normal operation of the battery system in which the operating states of the battery cells are detected and monitored by the respective cell controllers of the battery module over the course of individual cell management. The diagnostics period denotes a period over the course of a diagnostics operation of the battery system in which the operating states of the battery cells are detected and monitored by the battery management controller with respect to error logging. In this case, the diagnostics period may be triggered during operation of the battery system regularly, in particular, over the course of OBD (on-board diagnostics), optionally over the course of OBD2. In other words, the sampling period substantially corresponds to the period between two subsequent diagnostics periods, that is to say that period for which the individual cell management of the cell controllers is interrupted or paused. In the case of OBD2, a diagnostics period may be triggered at the latest after 500 ms (milliseconds). This means that the sampling periods during operation of the battery system are lower than or equal to 500 ms.

The first frequency value during the sampling period may be selected here in such a way that it satisfies the sampling theorem for the analog-to-digital converter connected downstream of the filter circuit. In other words, the first frequency value may be lower than or equal to half the sampling frequency of the analog-to-digital converter. The second frequency value during the diagnostics period is selected to the extent that the shortest possible diagnostics period is realized. In other words, the second frequency value is of a higher frequency than the first frequency value.

The filter circuit is therefore embodied as an analog, active filter, the cut-off frequency of which can be adjusted by the frequency circuit. The filter circuit is adjusted to a comparatively low cut-off frequency during the sampling period so that the most reliable and failsafe, most optimum sampling of the cell voltages possible is ensured. Over the course of a diagnostic analysis, in particular, an OBD2, the filter circuit is regularly adjusted to a comparatively high cut-off frequency for a diagnostics period, as a result of which an effective and time-saving diagnostics analysis and error logging is made possible.

A battery system for a transportation vehicle that meets both the requirements of the sampling theorem and of the OBD2 is therefore realized. During normal operation of the battery system, the cell voltages of the battery cells of the or of each battery module are detected reliably and in a failsafe manner by the BMS in accordance with the requirements of the sampling theorem. During diagnostics operation, the cut-off frequencies of the filter circuits are temporarily increased for the diagnostics period so that the current operating states are detected by the battery management controller in the shortest period possible. As a result thereof, the period during which there is no measurement of the cell voltages taking place by the cell controllers is reduced. A reliable and failsafe operation of the battery system is therefore ensured.

The filter circuit can be embodied, for example, as a high-pass filter, a low-pass filter, a band-stop filter or a band-pass filter, wherein, in the case of a band-stop filter or a band-pass filter, the upper and/or lower cut-off frequency can be adjusted by the frequency circuit.

The term "cut-off frequency" is to be understood to mean, in particular, a transition frequency or corner frequency, that is to say that frequency value at which, when it is exceeded, an input-side signal amplitude at the output of the filter circuit is reduced by a particular value. In the case of a high-pass or low-pass filter with a maximum (voltage) transmission factor of 1, the transmitting amplitude is decreased at the cut-off frequency to a value reduced by $1/\sqrt{2}$. A phase shift of $45°$ between the input and the output signal occurs at the cut-off frequency.

A battery system that is suitable for (electric) transportation vehicle applications is formed through the intermittent switching over of the cut-off frequency of the filter circuit.

The BMS, that is to say the battery management controller and the or each cell controller, is generally suitable and configured for carrying out the above-described switching over of the cut-off frequencies in terms of programming and/or circuitry technology. The BMS is therefore specifically configured to actuate the frequency circuit during the sampling period in such a way that the first frequency value for the cut-off frequency of the filter circuit is effected and that, upon triggering or effecting of the diagnostics period, the cut-off frequency is adjusted (switched over, changed) to the second frequency value.

In a disclosed embodiment, the battery management controller and/or the cell controller are formed at least essentially by a microcontroller comprising a processor and comprising a data memory in which the functionality for carrying out the switchover is implemented, in terms of programming technology, as operating software (firmware), with the result that the method—where necessary in interaction with a transportation vehicle user—is carried out automatically in the microcontroller when the operating software is executed.

However, within the context of the disclosure, the battery management controller and/or the cell controller can also alternatively be formed by a non-programmable electronic component, for example, an application-specific integrated circuit (ASIC), by virtue of the functionality for carrying out the switchover being implemented by way of circuitry methods or mechanisms.

The battery management controller may be embodied as a microcontroller and the or each cell controller is embodied at least partly as an ASIC.

In a disclosed embodiment, the battery system has a plurality of battery modules, which are connected or can be connected in series or else in parallel. The cell controllers of the plurality of battery modules are in this case led to the battery management controller in the manner of a daisy chain by a bus line. The daisy chain between the cell controllers may be realized by interfaces integrated into the cell controllers, as a result of which CAN interfaces of the battery system are reduced. In other words, the bus line is essentially formed by internal interfaces of the cell controllers. As a result thereof, a line-reducing battery system that is compact in terms of installation space is realized. In this case, a reliable and effective data transmission along the bus line, in particular, over the course of a diagnostics analysis of the battery system, is always realized by the adjustable cut-off frequencies.

The communication may therefore be realized by the communication bus (TPL, ISO-SPI, etc.) inherent to the cell controllers. As an alternative, it is likewise conceivable, for example, for the communication of the cell controllers to be converted to a standardized bus system, in particular, CAN, wherein the cell controllers may be coupled here to a low-voltage supply system.

In an expedient development, the filter circuit can be switched over between the frequency values in a reversible manner by the frequency circuit. As a result thereof, a suitable battery system is realized.

In a disclosed embodiment, the filter circuit is embodied as a low-pass filter. As a result thereof, it is ensured that the sampling theorem is satisfied during the sampling period.

In a suitable refinement, the filter circuit has an ohmic resistor, which is connected in series with the battery cells and with the analog-to-digital converter, and a first capacitor, which is connected in parallel with the battery cells and with the analog-to-digital converter. In other words, the filter circuit is embodied as an RC low-pass filter (RC element). As a result thereof, a cost-effective and component-reducing filter circuit is realized.

In a possible disclosed embodiment of the filter circuit, the frequency circuit is connected in parallel with a filter element (capacitor, resistor, coil) of the filter circuit. The frequency circuit in this case suitably has a second filter element of the same type as the filter element of the filter circuit. Upon actuation of the frequency circuit, the two filter elements are connected to one another in parallel so that the effectively active filter value (capacitance, resistance, inductance) changes and therefore the cut-off frequency is adjusted. The filter circuit is connected in parallel with the first capacitor of the RC element.

In a suitable development, the frequency circuit in this case has an actuable switching element and a second capacitor, which is connected in series with the switching element. As a result thereof, a flexible and effective filter circuit is realized.

The switching element is embodied, for example, as an electromechanical relay or, optionally, as an electronically switchable bipolar or field-effect transistor. The second capacitor can be connected in parallel with the first capacitor by way of the frequency circuit, as a result of which a parallel circuit of capacitances is realized when the switching element is closed. As a result thereof, the capacitance values of the first and second capacitance add up to form an effective total value, as a result of which the filter circuit effectively has a reduced cut-off frequency.

In other words, the switching element is closed, that is to say switched on, during the sampling period, with the result that the cut-off frequency is decreased or reduced to the first frequency value. During the diagnostics period, the switching element is opened, that is to say electrically switched off, with the result that only the first capacitance is active and the cut-off frequency of the filter circuit corresponds to the second frequency value.

In an alternative disclosed embodiment, the frequency circuit is embodied, for example, as a series circuit of a second ohmic resistor and the switching element, which series circuit is connected in parallel with the first resistor of the RC low-pass filter. As a result thereof, when the switching element is closed, the conductances of the ohmic resistors add up. This means that the active or effective resistance value is lower than the lowest resistance value of the two resistors. If the resistors are of equal dimensions, half of the resistance value is effectively active. As a result thereof, the cut-off frequency is increased. In this disclosed embodiment, the switching element is closed during the sampling period and open during the diagnostics period.

In an application, the battery system is built into a transportation vehicle. This means that the transportation vehicle has a battery system described above. The transportation vehicle is, in particular, an electrically driven or drivable transportation vehicle, optionally an electric or hybrid transportation vehicle. The battery system is in this case part of a transportation vehicle traction power supply system and is designed as a high-voltage voltage supply system. Owing to the switchover of the cut-off frequencies of the filter circuits over the course of a (transportation vehicle) diagnostics analysis or OBD, a suitable and failsafe operation of the battery system is ensured, which is transmitted to the operation of the transportation vehicle. As a result thereof, a suitable transportation vehicle is realized.

Parts and variables that correspond to one another are provided with the same reference signs in all of the figures.

The transportation vehicle 2 illustrated only in a highly schematized manner in FIG. 1 has a battery system 4. In this exemplary embodiment, the transportation vehicle 2 is, in particular, an electric or hybrid transportation vehicle, wherein the battery system 4 is designed as a high-voltage voltage supply system for the operation of an electromotive drive motor (not illustrated in any more detail). The battery system 4 is, as an electric or electrochemical energy store, part of a transportation vehicle traction power supply system. The battery system 4 can be connected to an intermediate circuit (not shown in any more detail) of the transportation vehicle 2 by two connections 6, 8.

In the schematic exemplary embodiment illustrated in FIG. 1, the battery system 4 has two battery modules 10. In this case, the battery modules 10 each have by way of example four battery cells 12 connected in series and are each embodied comprising a cell controller 14. The cell controller 14 is suitable and configured for individual module management and individual cell management. The cell controller 14 is thus a cell control system or cell control device, which, as a monitoring and control unit (cell supervision), monitors and controls a group of battery cells 12. The battery cells 12 are provided with reference signs in the figures purely by way of example.

The cell controllers 14 monitor the operating state of the battery module 10 and the number of battery cells 12 over the course of the individual cell management. The operating state is in this case monitored by detection of the respective (battery) cell voltages, which make it possible to determine relevant battery parameters. A respective state of charge (SOC) of the battery cells 12 is determined and monitored here. The cell controllers 14 may be in this case suitable and configured, in terms of circuitry, to detect and balance charge differences of the battery cells 12 of the respective battery module 10. In other words, the cell controllers 14 control and/or regulate the state of charge of the battery cells 12.

The cell controllers 14 of the battery modules 10 are coupled to one another in terms of signal technology in the manner of a daisy chain in terms of series circuitry by a bus line 16 and led to a common battery management controller 18. The battery management controller 18 is suitable and configured for temperature management and operation of the battery system 2. The battery management controller 18 detects, for example, the battery voltage applied to the connections 6, 8 as a measure of the operating state of the battery system 2 and furthermore has diagnostic and safety functions for an error-free and operationally reliable operation of the battery system 2. The battery management controller 18 furthermore has a communication line 19 for communication in terms of signal and/or data technology with a control unit of the transportation vehicle 2. The cell controllers 14 and the battery management controller 18 form a battery management system (BMS) of the battery system 2, the battery management system not being shown in any more detail.

The battery management controller 18 embodied, in particular, comprising a microcontroller is coupled in terms of signal technology to a battery isolating unit 20. The battery isolating unit 20 is arranged in the region of the connections 6, 8 and serves to connect and disconnect the battery system 2 to and from loads. In the shown exemplary embodiment of FIG. 1, the battery isolating unit 20 serves to connect and disconnect the battery system 2 to the intermediate circuit of the on-board power supply system. The battery isolating unit 20 is actuated by the battery management controller 18. The battery management controller 18 ensures here that the battery system 2 is protected reliably against fault currents and/or fault voltages. A two-pole disconnection of the battery cells 12 from the intermediate circuit is made possible here, which is beneficial with respect to maintenance and repair work of the battery system 2 and/or of the traction power supply system.

Figure 2:
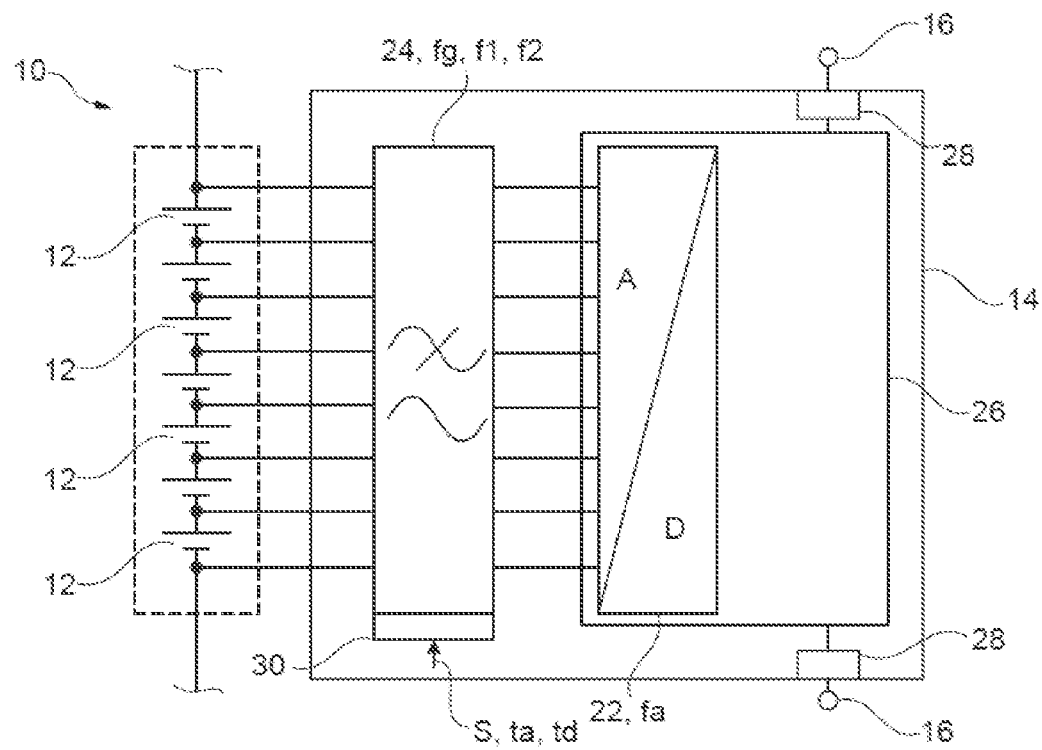
FIG. 2 schematically shows a block circuit diagram of a battery module of the battery system.

The design of a battery module 10 is explained in more detail below with reference to FIG. 2. The battery module 10 has a group, that is to say a packet or a stack of battery cells 12 embodied, for example, as lithium-ion cells. The battery cells 12 are embodied, for example, as pouch cells and are lined up next to one another and interconnected. The battery cells 12 are coupled to the cell controller 14 of the battery module 10.

The cell controller 14 has an analog-to-digital converter 22, which is led to the poles or connections of the battery cells 12 by a filter circuit 24. In this exemplary embodiment, the filter circuit 24 is part of the cell controller 14. In other words, the filter circuit 24 is integrated into the cell controller 14. The analog-to-digital converter 22 digitalizes the detected cell voltages of the battery cells 12 and transmits the digitalized output signal to an evaluation electronics system 26 of the cell controller 14. The evaluation electronics system 26 is embodied as an application-specific integrated circuit (ASIC) and is also referred to subsequently as this. The analog-to-digital converter 22 may be part of the ASIC 26.

The ASIC 26 transmits the evaluated data to the adjacent cell controllers 14 and to the battery management controller 18 by interfaces 28 integrated into the cell controller 14 via the thus formed bus line 16.

The analog-to-digital converter 22 samples the cell voltages of the battery cells 12 by a sampling frequency fa and generates the digital (measurement) signal based on the sampling points. To satisfy the Nyquist-Shannon sampling theorem, the filter circuit 24 has a cut-off frequency fg, which is less than or equal to half the sampling frequency fa of the analog-to-digital converter 22 (fg≤½ fa). The filter circuit 24 is embodied here as a low-pass filter.

The battery system 4 furthermore satisfies the requirements of on-board diagnostics (OBD), in particular, the so-called OBD2. This means that, during operation of the transportation vehicle 2, the operating state of the battery system 4, in particular, of each battery module 10 or each battery cell 12, is monitored regularly, and errors arising are transmitted to the (transportation vehicle) control device via the communication line 19 and stored there in an error memory. In other words, a diagnostics analysis or survey of the operating states of all of the battery modules 10 and therefore error logging take place periodically or regularly. The cut-off frequency fg of the filter circuit has a direct influence on a diagnostics period td required for the over the course of the OBD2.

During normal operation of the battery system 2, the operating states of the battery cells 12 are detected and evaluated by the cell controllers 14 during a sampling period ta. Over the course of OBD2, the normal operation, that is to say the individual cell management carried out by the cell controllers 14, is temporarily interrupted for the diagnostics period td, wherein the operating states of the battery cells 12, in particular, the associated sensors and actuators thereof, are monitored by the battery management controller 18 and transmitted to the (transportation vehicle) control device by the communication line 19.

The filter circuit 24 is provided here with a frequency circuit 30, by which the cut-off frequency fg of the filter circuit 24 can be adjusted or switched over, that is to say can be changed. The frequency circuit 24 is suitable and configured to adjust (switch over) the cut-off frequency fg of the filter circuit 24 to a first frequency value f1 during the sampling period ta and to a second frequency value f2 during the diagnostics period td. The frequency circuit 24 is suitable and configured here for reversible switchover of the cut-off frequency fg between the frequency values f1 and f2.

The frequency value f1 during the sampling period ta is selected here in such a way that it satisfies the sampling theorem with respect to the analog-to-digital converter 22 connected downstream of the filter circuit 24. In other words, the frequency value f1 may be less than or equal to half of the sampling frequency fa of the analog-to-digital converter 22 (fg=f1≤½fa).

The frequency value f2 during the diagnostics period td is selected to the extent that the shortest possible diagnostics period td is realized. In other words, the frequency value f2 is of a higher frequency than the frequency value f1 (f1<f2). To switch over between the frequency values f1 and f2, the frequency circuit 30 is actuated using a control signal S of the associated cell controller 14.

Two exemplary embodiments of the frequency circuit 30 are explained in more detail below with reference to FIGS. 3 and 4. In the exemplary embodiments shown, the filter circuit 24 is embodied in each case as an RC low-pass filter comprising an ohmic resistor 32 and comprising a capacitor 34 as filter element. The resistor 32 is in this case connected in series between the battery cells 12 and the analog-to-digital converter 22, wherein the capacitor 34 is connected in parallel with the inputs of the analog-to-digital converter 22.

Figure 3:
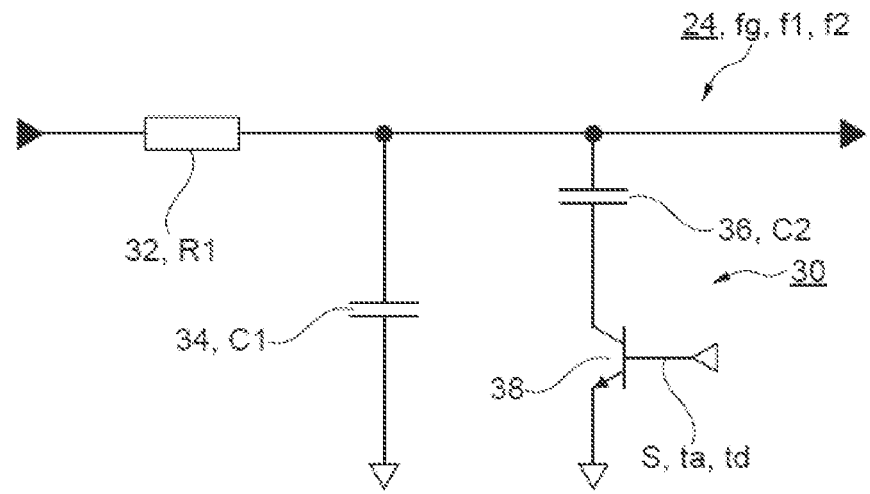
FIG. 3 shows a filter circuit of the battery system in accordance with a first disclosed embodiment.

In the exemplary embodiment of FIG. 3, the frequency circuit 30 is connected in parallel with the capacitor 34. The frequency circuit 30 in this case has a series circuit comprising a capacitor 36 acting as second filter element and comprising a switching element 38 that can be actuated by the control signal S. In this case, the switching element 38 is embodied as a bipolar transistor, wherein the control signal S is led to the control or base terminal. The resistor 32 has a resistance value R1. The capacitor 34 has a capacitance value C1 and the capacitor 36 has a capacitance value C2.

In the case of an open, that is to say switched-off, switching element 38, only the resistor 32 and the capacitor 34 of the RC low-pass filter are active, with the result that the resulting cut-off frequency fg for the analog-to-digital converter 22 is equal to $$fg = f2 = \frac{1}{2\pi R1 C1},$$

wherein Π is pi. In other words, the cut-off frequency fg is inversely proportional to the product of the resistance value R1 and the capacitance value C1. The filter circuit 24 therefore has a cut-off frequency fg equal to the frequency value f2.

In the case of a closed, that is to say switched-on, switching element 38, the capacitor 36 of the frequency circuit 30 is also active in addition to the resistor 32 and the capacitor 34 of the RC low-pass element, as a result of which the cut-off frequency fg results in $$fg = f1 = \frac{1}{2\pi R1(C1 + C2)}.$$

In this case, the cut-off frequency fg is inversely proportional to the product of the resistance value R1 and the sum of the capacitance values C1 and C2. The cut-off frequency fg is therefore adjusted to the frequency value f1.

In other words, the switching element 38 is closed during the sampling period ta, that is to say is switched on by the control signal S, with the result that the cut-off frequency fg is decreased or reduced to the frequency value f1. During the diagnostics period td, the switching element 38 is opened, that is to say is electrically switched off by the control signal S, with the result that only the first capacitance is active and the cut-off frequency fg of the filter circuit 24 corresponds to the higher-frequency frequency value f2.

Figure 4:
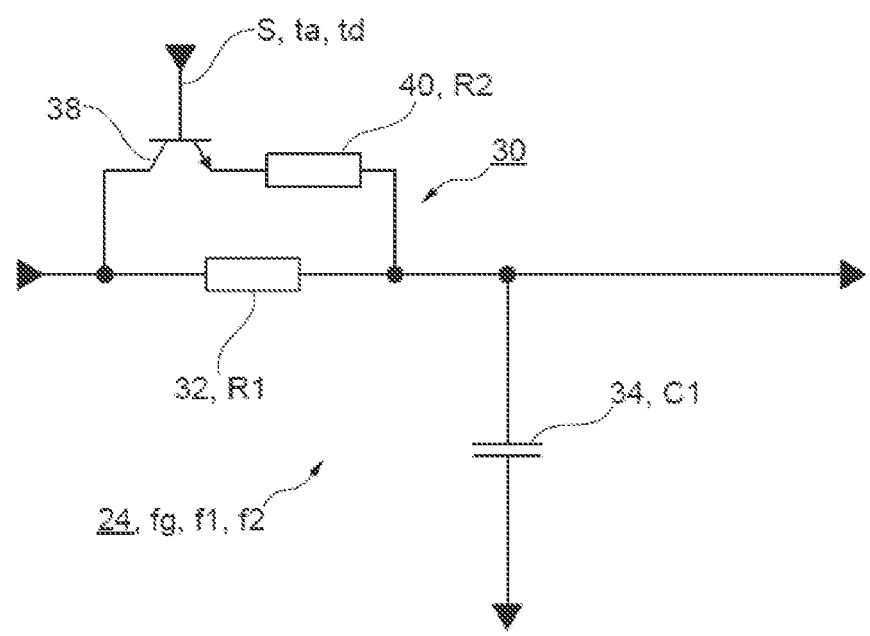
FIG. 4 shows the filter circuit of the battery system in accordance with a second disclosed embodiment.

In the alternative exemplary embodiment shown in FIG. 4, the frequency circuit 30 is connected in parallel with the resistor 32 of the RC low-pass filter. The frequency circuit 30 has in this case a series circuit of the switching element 38 and an ohmic resistor 40 with the resistance value R2. In this exemplary embodiment, the resistors 32 and 40 act as parallel-connected filter elements to adjust the cut-off frequency fg.

In the case of a closed switching element 38, the conductances of the ohmic resistors 32 and 40 add up. The active cut-off frequency fg is thus produced as $$fg = f2 = \frac{1}{2\pi \left(\frac{R_1 R_2}{K_1 + K_2}\right) C1},$$

which in this embodiment corresponds to the higher-frequency frequency value f2.

In the case of an open switching element 38, only the RC low-pass filter is active again, with the result that the resulting cut-off frequency fg for the analog-to-digital converter 22 is produced as $$fg = f1 = \frac{1}{2\pi R1 C1}.$$

In this exemplary embodiment, this corresponds to the lower-frequency frequency value f1.

In other words, the switching element 38 is open during the sampling period ta, as a result of which the cut-off frequency fg is adjusted to the lower-frequency frequency value f1. During the diagnostics period td, the switching element 38 is closed, with the result that the cut-off frequency fg of the filter circuit 24 is adjusted to the higher-frequency frequency value f2.

The difference between the frequency values f1 and f2 may be at least one order of magnitude.

In a suitable dimensioning of the exemplary embodiment shown in FIG. 3, the capacitance value C1 is, for example, equal to 10 nF (nanofarad) and the capacitance value C2 is equal to 470 nF. The resistance value R1 may be approximately 6.8 kOhm (kiloohm), with the result that the first frequency value f1 is approximately 48.8 kHz (kilohertz) and the second frequency value f2 is approximately 2.34 kHz.

In the exemplary embodiment of FIG. 4, the capacitance value C1 is, for example, equal to 470 nF, wherein the resistance value R1 is dimensioned to approximately 6.8 kOhm and the resistance value R2 is dimensioned to approximately 150 Ohm. The frequency value f1 therefore has, for example, a value of 49.8 kHz and the frequency value f2 has a value of approximately 2.31 kHz.

The disclosure is not limited to the exemplary embodiment described above. Instead, other embodiments can also be derived therefrom by the person skilled in the art without departing from the subject matter of the disclosure. All of the individual features described in connection with the exemplary embodiment can also be combined in another manner with one another without departing from the subject matter of the disclosure.

LIST OF REFERENCE SIGNS

2 Transpiration vehicle
4 Battery system
6, 8 Connection
10 Battery module
12 Battery cell
14 Cell controller
16 Bus line
18 Battery management controller
20 Battery isolating unit
22 Analog-to-digital converter
24 Filter circuit
26 Evaluation electronics system/ASIC
28 Interface
30 Frequency circuit
32 Resistor
34, 36 Capacitor
38 Switching element
40 Resistor
fa Sampling frequency
fg Cut-off frequency
to Sampling period
td Diagnostics period
f1, f2 Frequency value
S Control signal
R1, R2 Resistance value
C1, C2 Capacitance value

The invention claimed is:

1. A battery system for a transportation vehicle comprising:
at least one battery module including a plurality of battery cells and a cell controller for monitoring and adjusting a state of charge of the battery cells, wherein the cell controller includes an analog-to-digital converter that is coupled to the battery cells via a filter circuit;
a battery management controller coupled to the cell controller of each of the at least one battery modules;
a frequency circuit for adjusting a cut-off frequency of the filter circuit, wherein the cut-off frequency of the filter circuit is adjusted to a first frequency value during a sampling period in which cell controllers monitor the plurality of battery cells and to a second frequency value during a diagnostics period in which the battery management controller monitors the plurality of battery cells.

2. The battery system of claim 1, wherein each cell controller is coupled to the battery management controller as a daisy chain by a bus line.

3. The battery system of claim 1, wherein the filter circuit is switched between the first and second frequency values reversibly by the frequency circuit.

4. The battery system of claim 1, wherein the filter circuit is a low-pass filter.

5. The battery system of claim 1, wherein the filter circuit includes an ohmic resistor connected in series with the plurality of battery cells and with the analog-to-digital converter, and a first capacitor connected in parallel with the plurality of battery cells and with the analog-to-digital converter.

6. The battery system of claim 1, wherein the frequency circuit is connected in parallel with a filter element of the filter circuit.

7. The battery system of claim 1, wherein the frequency circuit includes an actuable switching element and a second capacitor connected in series with the switching element.

8. A transportation vehicle comprising a battery system including:
  at least one battery module including a plurality of battery cells and a cell controller for monitoring and adjusting a state of charge of the battery cells, wherein the cell controller includes an analog-to-digital converter that is coupled to the battery cells via a filter circuit;
  a battery management controller coupled to the cell controller of each of the at least one battery modules;
  a frequency circuit for adjusting a cut-off frequency of the filter circuit, wherein the cut-off frequency of the filter circuit is adjusted to a first frequency value during a sampling period in which cell controllers monitor the plurality of battery cells and to a second frequency value during a diagnostics period in which the battery management controller monitors the plurality of battery cells.

9. The transportation vehicle of claim 8, wherein each cell controller is coupled to the battery management controller as a daisy chain by a bus line.

10. The transportation vehicle of claim 8, wherein the filter circuit is switched between the first and second frequency values reversibly by the frequency circuit.

11. The transportation vehicle of claim 8, wherein the filter circuit is a low-pass filter.

12. The transportation vehicle of claim 8, wherein the filter circuit includes an ohmic resistor connected in series with the plurality of battery cells and with the analog-to-digital converter, and a first capacitor connected in parallel with the plurality of battery cells and with the analog-to-digital converter.

13. The transportation vehicle of claim 8, wherein the frequency circuit is connected in parallel with a filter element of the filter circuit.

14. The transportation vehicle of claim 8, wherein the frequency circuit includes an actuable switching element and a second capacitor connected in series with the switching element.

* * * * *